(12) United States Patent
Seo

(10) Patent No.: US 8,860,226 B2
(45) Date of Patent: Oct. 14, 2014

(54) METHOD OF MANUFACTURING SEMICONDUCTOR DEVICE

(75) Inventor: Yong Won Seo, Wonju (KR)

(73) Assignee: Hynix Semiconductor Inc., Icheon-Si (KR)

( * ) Notice: Subject to any disclaimer, the term of this patent is extended or adjusted under 35 U.S.C. 154(b) by 200 days.

(21) Appl. No.: 13/346,910

(22) Filed: Jan. 10, 2012

(65) Prior Publication Data

US 2012/0292690 A1 Nov. 22, 2012

(30) Foreign Application Priority Data

May 17, 2011 (KR) ........................ 10-2011-0046532

(51) Int. Cl.
*H01L 23/52* (2006.01)
*H01L 27/108* (2006.01)
*H01L 29/423* (2006.01)
*H01L 21/768* (2006.01)
*H01L 29/417* (2006.01)

(52) U.S. Cl.
CPC .... *H01L 27/10885* (2013.01); *H01L 27/10888* (2013.01); *H01L 29/4236* (2013.01); *H01L 21/76828* (2013.01); *H01L 29/41783* (2013.01); *H01L 27/10876* (2013.01); *H01L 27/10855* (2013.01)

USPC .......... 257/774; 257/734; 257/739; 257/773; 257/E23.141; 257/E23.152

(58) Field of Classification Search
USPC ................ 257/288, 394, 734, 739, 773, 774, 257/E29.006, E23.141, E23.151, E23.152
See application file for complete search history.

(56) References Cited

U.S. PATENT DOCUMENTS

| | | | | |
|---|---|---|---|---|
| 5,202,279 A | * | 4/1993 | Chung et al. | 438/386 |
| 5,955,768 A | * | 9/1999 | Liaw et al. | 257/383 |
| 7,964,461 B2 | * | 6/2011 | Seo | 438/257 |
| 2006/0237851 A1 | * | 10/2006 | Ko et al. | 257/774 |
| 2008/0067692 A1 | * | 3/2008 | Kim et al. | 257/774 |
| 2008/0121960 A1 | * | 5/2008 | Ohuchi | 257/296 |
| 2008/0266927 A1 | * | 10/2008 | Lee et al. | 365/63 |

FOREIGN PATENT DOCUMENTS

| | | |
|---|---|---|
| KR | 10-2008-0001415 A | 1/2008 |
| KR | 10-2011-0001136 A | 1/2011 |

\* cited by examiner

*Primary Examiner* — Eduardo A Rodela

(57) ABSTRACT

A semiconductor device includes a storage node contact plug, a bit line in communication with to the storage node contact plug, and an expansion unit formed on a sidewall of the bit line. Thermal expansion of the expansion unit serves to increase capacitance by ensuring a distance between the bit line and the storage node contact plug, thereby improving a sensing margin. A cell characteristic such as a record recovery time (tWR) may be enhanced.

15 Claims, 4 Drawing Sheets

METHOD OF MANUFACTURING SEMICONDUCTOR DEVICE

CROSS-REFERENCES TO RELATED APPLICATION

The present application claims priority to Korean patent application number 10-2011-0046532, filed on 17 May 2011, which is incorporated by reference in its entirety.

BACKGROUND OF THE INVENTION

1. Technical Field

The inventive concept relates to a method of manufacturing a semiconductor device, and more particularly, to a method of manufacturing a semiconductor device including a bit line and a storage node contact plug.

2. Related Art

Dynamic random access memories (DRAMs) of semiconductor storage devices include a plurality of unit cells, each of which includes a capacitor and a transistor. The capacitor is used to temporarily store data, and the transistor is used to transfer data between a bit line and the capacitor in response to a control signal delivered through a word line. The transistor comprises three regions of a gate, a source, and a drain. Charges move between the source and the drain according to the control signal input to the gate. The charges move between the source and the drain through a channel region.

When a conventional transistor is fabricated on a semiconductor substrate, a gate is formed in a semiconductor substrate, and a source and a drain are formed by doping the semiconductor substrate with impurities on either side of the gate. A region of the semiconductor substrate below the gate between the source and the drain becomes a channel region of the transistor. A transistor with a horizontal channel region occupies a constant area of the semiconductor substrate. In a complex semiconductor storage device, it is difficult to reduce the total area due to the amount of space occupied by transistors.

When the total area of a semiconductor storage device is reduced, the number of the semiconductor storage devices that can be made from a single wafer is increased, resulting in an overall improvement in production yields.

Various methods for reducing the total area of a semiconductor storage device have been suggested. One of these methods is a recess gate, in which a recess is formed in a semiconductor substrate, and a channel region is formed along a portion of the recess.

A buried gate in which a gate is formed to be entirely buried within a recess has been studied. In a buried gate structure, a bit line is disposed between two storage node contact plugs. As dimensions of the device are reduced, the distance between a bit line and the storage node contact plug decreases, resulting in increased capacitance and reduced sensing margins. As the sensing margin is reduced, cell characteristics including the record recovery time (tWR) are degraded.

SUMMARY

Embodiments of the present invention provide a method of manufacturing a semiconductor device capable of increasing capacitance by ensuring a distance between a bit line and a storage node contact plug, and improving the cell characteristic of a record recovery time (tWR) by improving a sensing margin.

According to one aspect of an exemplary embodiment, a method of manufacturing a semiconductor device is provided. The method includes forming a first insulating layer having a first coefficient of thermal expansion (CTE) over a semiconductor substrate; forming a bit line contact hole in the first insulating layer; forming a bit line conductive material in the first insulating layer; etching the bit line conductive material to form a bit line; forming a second insulating layer having a second CTE higher than the first CTE over the first insulating layer and the bit line so that an upper portion of the bit line is exposed; forming a third insulating layer having a third CTE lower than the second CTE, over the exposed portion of the bit line and the second insulating layer; forming a storage node contact hole exposing the semiconductor substrate by etching the third insulating layer, the second insulating layer, and the first insulating layer; and expanding the second insulating layer on a sidewall of the storage node contact hole by heating.

Certain embodiments of the method may further include forming a buried gate within the semiconductor substrate before the forming the first insulating layer. The forming the bit line and the bit line contact plug may include forming a polysilicon layer, a barrier metal layer, a bit line conductive layer, and a hard mask layer on the bit line contact hole, forming a photosensitive layer pattern defining the bit line on the hard mask layer, and etching the hard mask layer, the bit line conductive layer, the barrier metal layer, and the polysilicon layer using the photosensitive layer pattern defining the bit line as an etch mask. Here, the barrier metal layer may include any one selected from the group consisting of a titanium (Ti) layer, a titanium nitride (TiN) layer, and a combination thereof. The bit line conductive layer may include a material including tungsten (W).

The first insulating layer and the third insulating layer may include the same material. For example, the first insulating layer and the third insulating layer may include a material including a low pressure tetra ethyl ortho silicate (LP-TEOS) layer. The second insulating layer may include a material including a plasma enhanced tetra ethyl ortho silicate (PE-TEOS) layer.

The expanding of the second insulating layer may include performing a rapid thermal annealing process on the semiconductor substrate in which the storage node contact hole is formed. The rapid thermal annealing process may be performed at a temperature of 800° C. to 1200° C.

The forming of the storage node contact hole may include forming the storage node contact hole at both sides of the bit line and the bit line contact plug. The method may further include, after the forming the storage node contact hole, forming a conductive material on an entire surface of the semiconductor substrate including the storage node contact hole and forming the storage node contact plug by planarization-etching the conductive material until the third insulating layer is exposed.

According to another aspect of another exemplary embodiment, a semiconductor device includes a bit line contact plug formed in a semiconductor substrate, a bit line connected to the bit line contact plug, and an expansion unit formed on a sidewall of the bit line.

The semiconductor device may further include a buried gate formed within the semiconductor substrate. The bit line contact plug may include a polysilicon layer. The bit line may include a polysilicon layer, a barrier metal layer, a bit line conductive layer, and a hard mask layer. The barrier metal layer may include any one selected from the group consisting of a Ti layer, a TiN layer, and a combination thereof. The bit line conductive layer may include W.

The expansion unit may be formed on a sidewall of the bit line conductive layer and include a PE-TEOS layer. The semiconductor device may further include an insulating layer formed on a sidewall and an upper surface of the hard mask layer. A linewidth of the expansion unit may be larger than that of the insulating layer.

These and other features, aspects, and embodiments are described below in the section entitled "DESCRIPTION OF EXEMPLARY EMBODIMENTS".

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EXEMPLARY EMBODIMENTS

Figure 1:
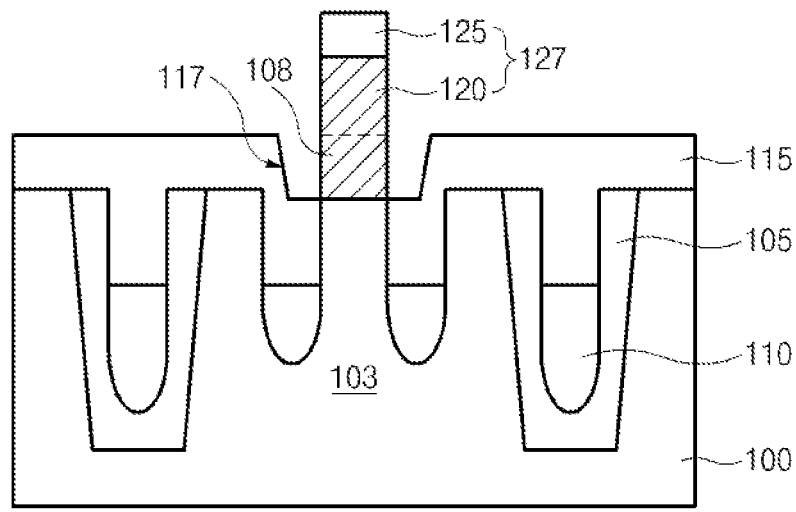
FIGS. 1 to 5 are cross-sectional views illustrating a method of manufacturing a semiconductor device according to exemplary embodiments of the present invention.

Exemplary embodiments are described herein with reference to cross-sectional illustrations that are schematic illustrations of the embodiments and intermediate structures. As such variations from the shapes of the illustrations (as a result, for example, of manufacturing techniques and/or tolerances) may be present. Thus, exemplary embodiments should not be construed as limited to the particular shapes of regions illustrated herein, and may include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

Hereinafter, methods of manufacturing a semiconductor device according to exemplary embodiments will be described in further detail with reference to accompanying drawings.

FIGS. 1 to 5 are cross-sectional views illustrating methods of manufacturing a semiconductor device according to exemplary embodiments.

First, referring to FIG. 1, a trench for device isolation which defines active region 103 is formed by etching a semiconductor substrate 100. Next, an insulating layer is formed within the trench to form isolation layer 105, which performs the function of device isolation. Subsequently, a mask pattern (not shown) defining an area to be occupied by a buried gate is formed on the semiconductor substrate 100. The semiconductor substrate is etched using the mask pattern (not shown) as an etch mask in which a trench for forming the buried gate will be formed.

Next, a gate conductive material is formed on the upper surface of the semiconductor substrate 100 including the trench. The gate conductive material may be formed by stacking a titanium nitride (TiN) layer and a tungsten (W) layer. In an embodiment, the TiN layer is thinly deposited along an inner wall of the trench, and the W layer is deposited on the TiN layer to a thickness sufficient to entirely fill the trench. However, the gate conductive material is not limited to the stacked structure of the TiN layer and the W layer. In other embodiments, the gate conductive material may include only one of either the TiN layer or the W layer, or other similar suitable materials. After being deposited in the trench, the gate conductive material is etched through an etch-back process to form a gate 110. The resulting structure of a gate disposed within a trench may be referred to as a buried gate.

Next, a first insulating layer 115 is formed on the semiconductor substrate 100 including the gate 110. In an embodiment, the first insulating layer 115 is a sealing layer for sealing the gate 110. The first insulating layer may include a low pressure tetra ethyl ortho silicate (LP-TEOS) layer.

A mask pattern (not shown) exposing a region in which a bit line contact hole is to be formed is then formed on the first insulating layer 115. The first insulating layer is etched using the mask pattern (not shown) as an etch mask to form a bit line contact hole 117 exposing a portion of the active region 103. Subsequently, a polysilicon layer, a barrier metal layer (not shown), a bit line conductive layer 120, and a bit line hard mask layer 125 are formed over the portion of the active region 103 exposed by the bit line contact hole 117. An ion implantation process may be performed on the polysilicon layer. The bit line conductive layer 120 may comprise a material with high electrical conductivity such as tungsten. The barrier metal layer (not shown) may include titanium (Ti), TiN, tungsten nitride (WN), or a combination thereof. The hard mask layer 125 may include nitride.

Next, a mask pattern defining a bit line is formed on the bit line hard mask layer 125. The bit line hard mask layer 125, the bit line conductive layer 120, and the polysilicon layer are all etched using the mask pattern as an etch mask to form bit line 127. In the process of etching to firm bit line 127, the etched polysilicon layer becomes contact plug 108. In an embodiment, the bit line etching process is conducted so that the widths of contact plug 108 and bit line 127 are less than the width of bit line contact hole 117. The bit line 127 with a smaller linewidth than the bit line contact hole 117 is referred to as an inner global bit line (GBL). The difference in linewidths is effective to reduce the likelihood of bit line 127 being short-circuited with a subsequently formed storage node contact plug.

Figure 2:
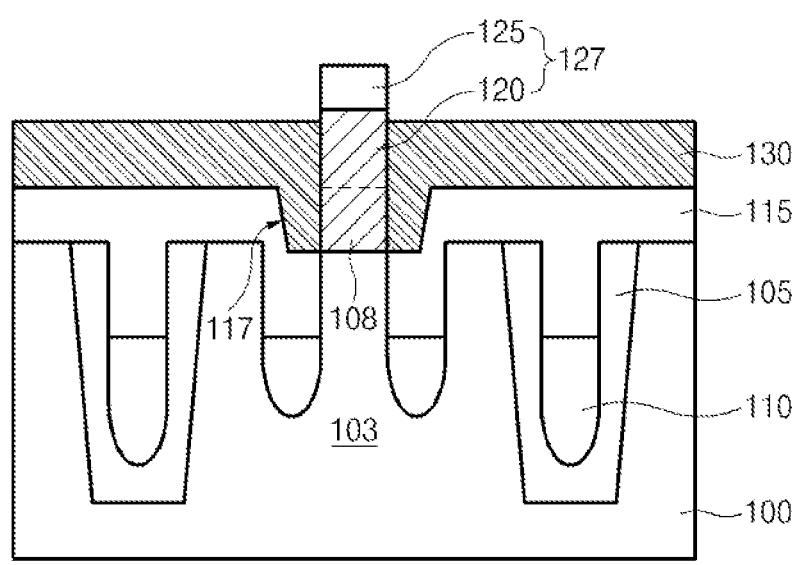

Referring to FIG. 2, a second insulating layer 130 is formed over an upper surface of the semiconductor including the bit line 127, and an etch-back process is performed on the second insulating layer 130 to expose an upper portion of the bit line 127. In an embodiment, the hard mask layer 125 which is an upper portion of the bit line 127 may be entirely exposed, and an upper portion of the bit line conductive layer 120 may be partially exposed.

In addition, the second insulating layer 130 may include a material having a higher coefficient of thermal expansion (CTE) than the first insulating layer 115. The second insulating layer may comprise plasma enhanced tetra ethyl ortho silicate (PE-TEOS).

Figure 3:
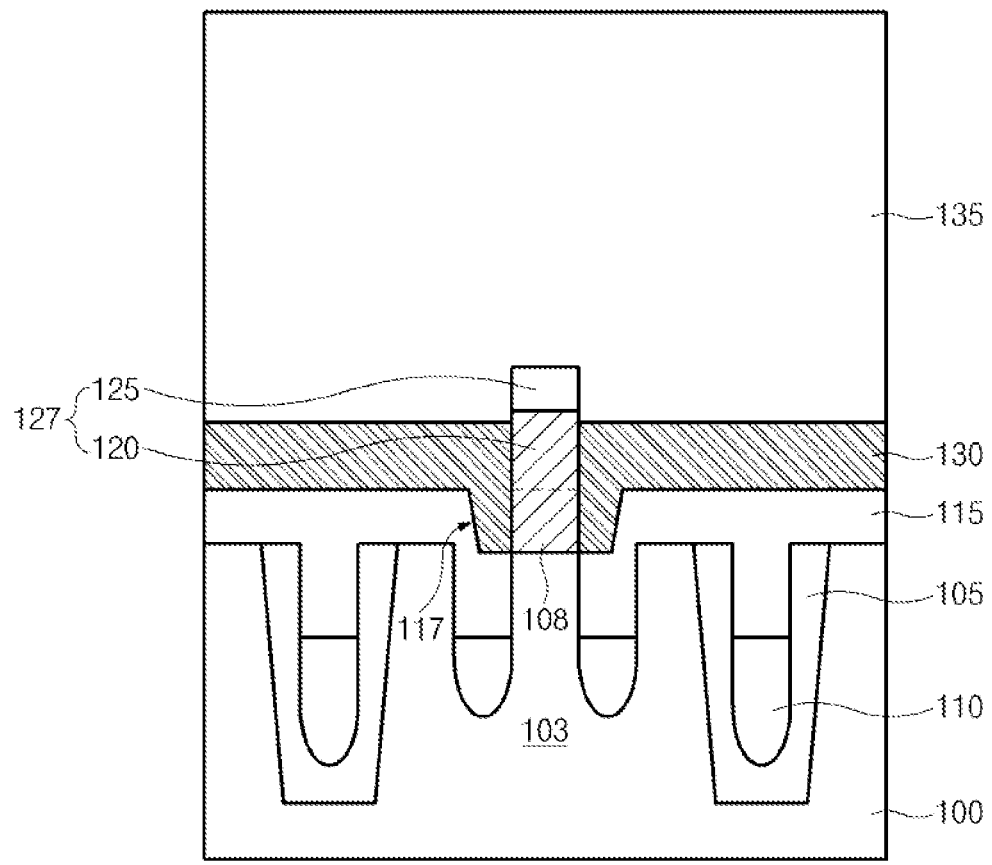

Referring to FIG. 3, a third insulating layer 135 is formed over the exposed bit line 127 and the second insulating layer 130. The third insulating layer 135 may include a material having a lower CTE than the second insulating layer 130. The third insulating layer 135 may include the same material as the first insulating later 115. In an embodiment, both layers comprise LP-TEOS. By forming the third insulating layer 135, the second insulating layer 130 with a higher CTE is interposed between first and third insulating layers 115 and 135 that have a lower CTE.

To describe the CTE in more detail, LP-TEOS, which may be used for both the first insulating layer 115 and the third insulating layer 135, has a CTE of 0.35 ppm/° C. In contrast, the PE-TEOS layer which may be used for the second insulating layer 130 has a CTE of 1.0 ppm/° C. Therefore, when an annealing process is performed, the second insulating layer 130 with a high CTE expands more than the first and third insulating layers 115 and 135 which have a lower CTE.

Figure 4:
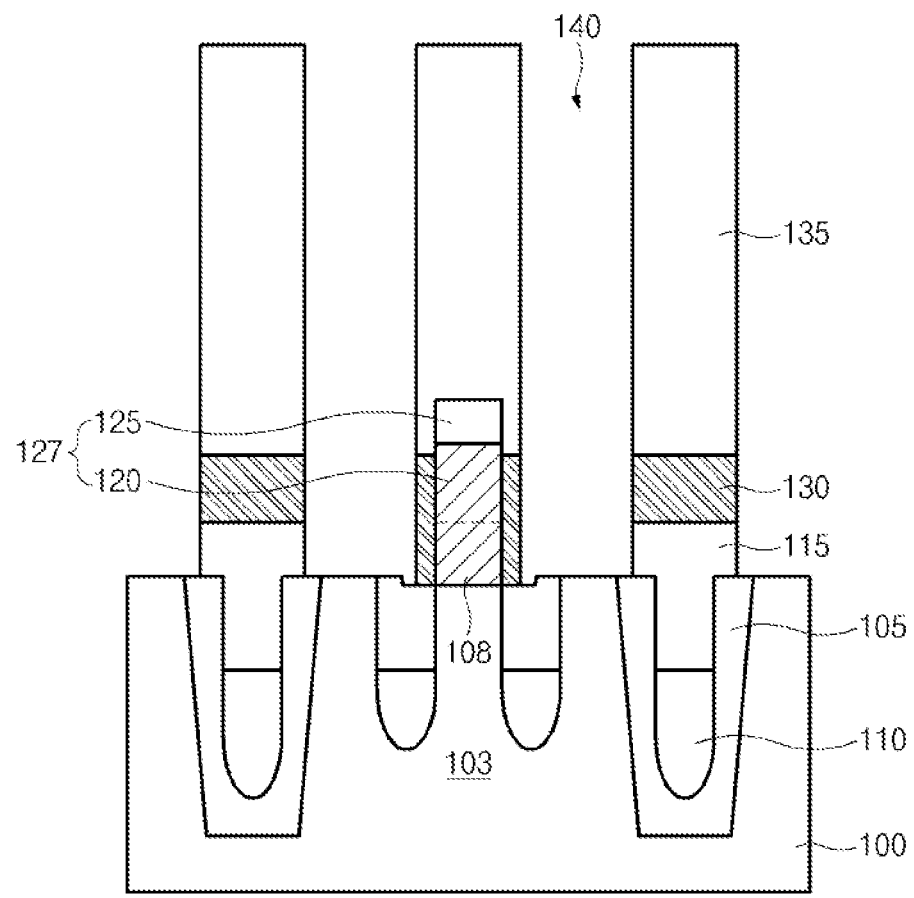

Referring to FIG. 4, a mask pattern (not shown) exposing a storage node formation region is formed on the third insulating layer 135. The third insulating layer 135, the second insulating layer 130, and the first insulating layer 115 are sequentially etched using the mask pattern as an etch mask to form a storage node contact hole 140. As a result, bit line 127 is interposed between two adjacent storage node contact holes 140. Furthermore, in an embodiment, portions of second insulating layer 130 remain between a sidewall of bit line 127 and storage node contact hole 140. In another embodiment, portions of second insulating layer 130 disposed over isolation layer 105 are etched before forming third insulating layer 135, leaving portions of second insulating layer 130 over sidewalls of bit line 127.

Figure 5:
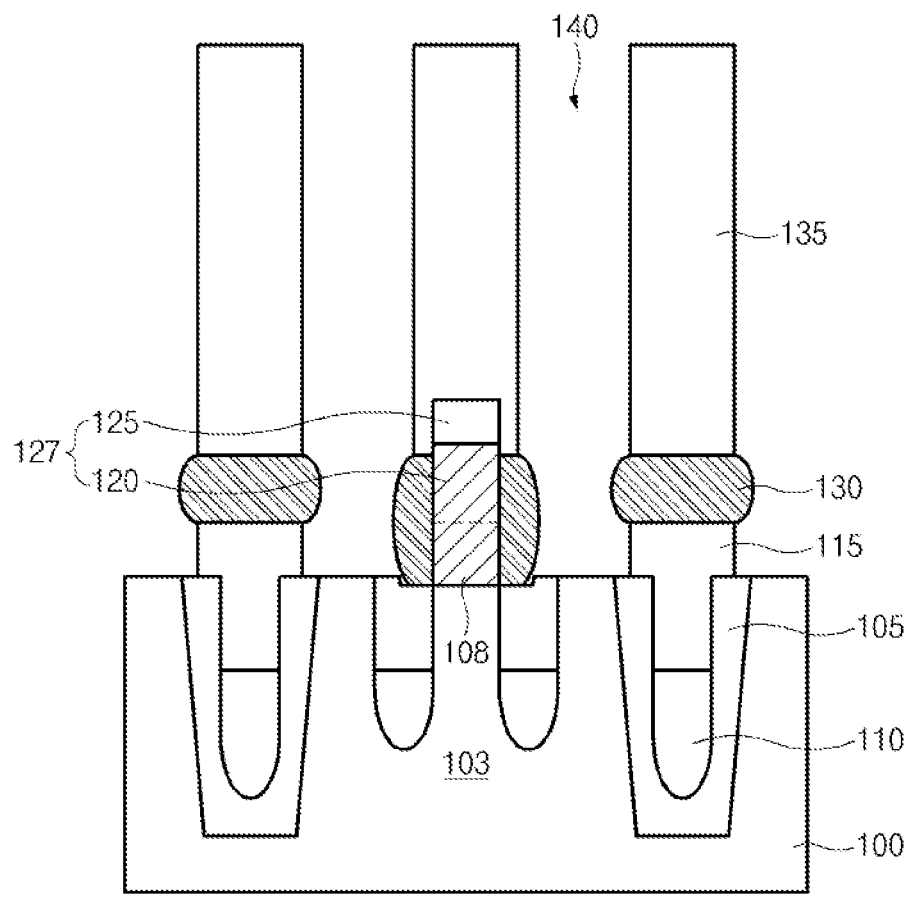

Referring to FIG. 5, an annealing process is performed on the semiconductor device. The annealing process (which may include a rapid thermal annealing process) may be performed at a temperature of between 800° C. and 1200° C. When the annealing process is performed, the second insulating layer 130 having the relatively high thermal expansion coefficient is expanded more than the first and third insulating layers 115 and 135 having the relatively low thermal expansion coefficient. As a result, a linewidth D of the second insulating layer 130 on a sidewall of the bit line 127 is increased as shown by expansion element '130a' of FIG. 5. Second insulating layer 130 retains an expanded volume relative to its originally deposited volume after heat has been removed, which results in the bulged structure in the horizontal plane as shown in FIG. 5. In an embodiment, the expansion may be an expansion in the vertical plane as well, which may affect the design of the semiconductor device dimensions accordingly.

A conductive material layer is formed on an entire surface of the semiconductor substrate 100 to fill the storage node contact hole 140, and then a planarization process is performed until the third insulating layer 135 is exposed, thereby forming a storage node contact plug 145. Accordingly, a distance between the bit line 127 and the storage node contact plug 145 is increased without increasing the overall linewidth of the insulating layers, which would reduce the contact area of the storage node contact plug 145 in a device of the same density.

As described above, in an exemplary embodiment, the second insulating layer on sidewalls of the storage node contact plug 145 and the bit line 127 is expanded in a streamlined shape, and thus the distance D between the storage node contact plug 145 and the bit line 127 is increased. Thus, it is possible to increase the sensing margin due to a reduced level of capacitance.

Moreover, because bottom areas of the storage node contact plug 145 and the bit line contact plug 108 (which may be a polysilicon layer) are maintained, contact resistance is substantially maintained, so embodiments of the present invention may not substantially compromise contact resistance.

A semiconductor device according to an exemplary embodiment of the inventive concept will be described with reference to FIG. 5. The semiconductor device of FIG. 5 may be formed by methods other than a method as shown in FIGS. 1 to 4.

Referring to FIG. 5, a buried gate 110 is formed within the semiconductor substrate 100 including the active region 103 and the isolation layer 105. The bit line contact plug 108 which is the polysilicon layer is formed on the active region between the buried gates 110. The bit line 127 connected to the bit line contact plug 108 which is the polysilicon layer is included. The storage node contact plug 145 connected to the active region 103 at either side of the bit line 127 is included.

At this time, the bit line 127 is formed of a stacked structure of the bit line conductive layer 120 and the bit line hard mask layer 125 and further includes the expansion unit 130a on a sidewall of the bit line contact layer 120. The expansion unit 130a may be formed on a sidewall of the bit line contact plug 108 which is the polysilicon layer. The expansion unit 130a is formed in a streamlined shape by thermal expansion of the insulating layer in the sidewall of the bit line 127 and thus the distance 'D' between the storage node contact plug 145 and the bit line 127 is increased. Thus, an effect of increasing a sensing margin can be obtained due to reduction in capacitance.

Semiconductor devices according to certain embodiments of the present invention may provide one or more of the following effects.

First, the distance between a bit line and a storage node contact plug is increased, resulting in a reduced capacitance relative to conventional techniques.

Second, a sensing margin can be improved with reduction in the capacitance.

Thirdly, a cell characteristic such as a record recovery time (tWR) can be improved.

The above embodiments of the present invention are illustrative and not limitative. Various alternatives and equivalents are possible while remaining within the scope and spirit of the present invention. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
a bit line contact plug formed over a semiconductor substrate;
a bit line coupled to the bit line contact plug, the bit line including a bit line conductive layer and a hard mask layer; and
an expansion unit disposed on a sidewall of the bit line conductive layer and the bit line contact plug,
wherein a width of a central portion of the expansion unit is greater than a width of an upper portion of the expansion unit and a width of a lower portion of the expansion unit.

2. The semiconductor device of claim 1, further comprising a buried gate disposed within the semiconductor substrate and coupled to the bit line.

3. The semiconductor device of claim 1, wherein the bit line contact plug includes a polysilicon layer.

4. The semiconductor device of claim 1, wherein the bit line includes a barrier metal layer, a bit line conductive layer, and a hard mask layer.

5. The semiconductor device of claim 4, wherein the barrier metal layer includes any one selected from the group consisting of a titanium (Ti) layer, a titanium nitride (TiN) layer, and a combination thereof.

6. The semiconductor device of claim 4, wherein the bit line conductive layer includes tungsten (W).

7. The semiconductor device of claim 4, further comprising an insulating layer disposed on a sidewall and an upper surface of the hard mask layer.

8. The semiconductor device of claim 7, wherein the insulating layer includes low pressure tetra ethyl ortho silicate (LP-TEOS).

9. The semiconductor device of claim 7, wherein a linewidth of the expansion unit is larger than a linewidth of the insulating layer.

10. The semiconductor device of claim 7, wherein the expansion unit is configured to have a first volume when it is originally formed, a second volume when thermal energy is applied to the expansion unit, and a third volume after the thermal energy that induced the second volume is no longer applied, and wherein the second and third volumes are larger than the first volume.

11. The semiconductor device of claim 1, wherein the expansion unit includes plasma enhanced tetra ethyl ortho silicate (PE-TEOS).

12. The semiconductor device of claim 1, wherein the expansion unit is a unit that permanently expands its size.

13. The semiconductor device of claim 1, wherein a lower portion of the expansion unit is disposed in a bit line contact hole.

14. The semiconductor device of claim 1, further comprising first and second trenches disposed on opposing sides of the bit line;
wherein the expansion unit extends from the sidewalls of the conductive layer of the bit line to a first insulation layer filling an upper portion of the first and second trenches.

15. A semiconductor device, comprising:
a bit line contact plug formed over a semiconductor substrate;
a bit line coupled to the bit line contact plug, the bit line including a bit line conductive layer and a hard mask layer;
an expansion unit disposed on a sidewall of the bit line conductive layer and the bit line contact plug; and
first and second trenches disposed on opposing sides of the bit line,
wherein the expansion unit extends from the sidewalls of the conductive layer of the bit line to a first insulation layer filling an upper portion of the first and second trenches.

* * * * *